(12) United States Patent
Schwartz (10) Patent No.: US 7,162,046 B2
(45) Date of Patent: *Jan. 9, 2007

(54) MICROPHONE-TAILORED EQUALIZING SYSTEM

(76) Inventor: Stephen R. Schwartz, 172 Congdon St., Providence, RI (US) 02906

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/072,412

(22) Filed: May 4, 1998

(65) Prior Publication Data

US 2001/0043704 A1 Nov. 22, 2001

(51) Int. Cl.
*H03G 5/00* (2006.01)
(52) U.S. Cl. ........................................................ 381/98
(58) Field of Classification Search ................ 381/203, 381/98, 103; 84/723, 736, 738, 730, 731
See application file for complete search history.

(56) References Cited

U.S. PATENT DOCUMENTS

| 4,118,601 | A | * | 10/1978 | Yeap | |
|---|---|---|---|---|---|
| 4,306,113 | A | * | 12/1981 | Morton | |
| 4,311,872 | A | * | 1/1982 | Davis | 330/294 |
| 4,316,060 | A | * | 2/1982 | Adams et al. | 381/98 |
| 4,340,780 | A | * | 7/1982 | Odlen | 381/103 |
| 4,389,915 | A | | 6/1983 | Bione | 84/1.24 |
| 4,696,214 | A | | 9/1987 | Ichiki | 84/1.01 |
| 4,882,963 | A | | 11/1989 | Ichiki | 84/1.01 |
| 4,947,723 | A | | 8/1990 | Kawashima et al. | 84/603 |
| 4,991,218 | A | | 2/1991 | Kramer | 381/61 |
| 4,994,770 | A | * | 2/1991 | Niwayama | 381/98 |
| 5,194,681 | A | | 3/1993 | Kudo | 84/603 |
| 5,466,882 | A | | 11/1995 | Lee | 84/603 |
| 5,506,910 | A | * | 4/1996 | Miller et al. | 381/103 |
| 5,521,322 | A | | 5/1996 | Morikawa et al. | 84/603 |
| 5,537,614 | A | * | 7/1996 | Hagimori et al. | 381/58 |
| 5,714,918 | A | * | 2/1998 | Menkhoff | 333/28 R |
| 5,765,134 | A | * | 6/1998 | Kehoe | 381/61 |
| 6,141,425 | A | * | 10/2000 | Murayama et al. | 381/98 |

OTHER PUBLICATIONS

Bartlett, Bruce, "Tonal Effects of Close Microphone Placement"; Journal of Audio Engineering Society, vol. 29, No. 10 Oct. 1981, pp. 726-738.*
K&K Sound Systems, Drum and Percussion Microphones; pp. 1-2 (http://www.kksound.com/drumic.htm).

* cited by examiner

*Primary Examiner*—Brian T. Pendleton
(74) *Attorney, Agent, or Firm*—Kenyon & Kenyon LLP (57) ABSTRACT

A method and system is described to improve the reproduction of sound of an acoustic musical instrument. According to one embodiment, a first microphone is placed at a proximate location to the musical instrument to pick up the sound of the musical instrument. The sound as picked up by the first microphone is compared to a reference sound of the instrument (e.g., the sound of the instrument as perceived at a normal listening position). Based on this comparison, a tailor-made equalizer is designed to compensate for the differences between the sounds as picked up by the first microphone and the reference sounds of the musical instrument. Accordingly, using the tailor-made equalizer allows the reproduction of sound from the first microphone to have a quality similar to that of the reference sound of the musical instrument. In an implementation of the above system, a filter arrangement is provided having a low-pass and a high-pass filter that allows separate control of the frequency and/or gain for each filter.

18 Claims, 4 Drawing Sheets

MICROPHONE-TAILORED EQUALIZING SYSTEM

BACKGROUND OF THE INVENTION

1. Field of the Invention

The invention relates to microphone pickup and electronic amplification of musical instruments, particularly acoustic musical instruments, for concerts or recordings.

2. Background Art

Pickups for electronically reproducing sound from musical instruments are of two general types, pressure and vibration. A pressure pickup or microphone has a diaphragm that vibrates in response to acoustic pressure variations in air. The diaphragm vibrations are transformed into an electrical signal. Since the human ear also has a diaphragm that works in the same way, the acoustic response of a good pressure type microphone located at an optimal distance from a musical instrument approximates the sound of the instrument in a given room. Pressure-type microphones present problems of isolation, placement, and feedback, however.

The isolation problem results from pickup sounds from both desired sources (the instrument or instruments that one wants to amplify) and undesired sources (e.g., a cough or another musical instrument that one wishes to amplify separately). The conventional approach to minimizing the isolation problem is to place the microphone close to the selected instrument to be picked up and to use a so-called directional microphone, which attempts to reject sound from unwanted directions.

Since sound radiates by the inverse square law, moving the microphone closer to the instrument reduces the isolation problem by increasing the amplitude of sound from the selected instrument relative to the sound from other sources. This solution, however, increases the placement problem. Musical instruments generate sound from different parts, such as the strings, sound box, and front and back surfaces of a violin. At a normal listening distance from a musical instrument, the characteristic sound of the instrument is an amalgam of the sounds generated from each part.

Different spots in the area close to an instrument (especially within a foot or so) yield very different sounds, most or all of which a listener would consider unnatural. When extremely close (less than a few inches), the differences become so exaggerated that one spot sounds very different from another, and it can be difficult to tell what instrument is being listened to. Also, if the instrument is not stationary, but is held by the musician (guitar, violin, flute, etc.), small normal movements of the performer produce unintended and undesired changes in dynamic level (volume) and tone quality.

Feedback is a special circumstance arising from isolation and placement problems, typically during the types of live performance where performers hear themselves by listening to monitor speakers aimed in their direction. These speakers are thus also aimed at the microphone used to pick up the sound initially. This can create a positive feedback loop that drives the speaker amplifier into saturation, producing a loud howl. The usual corrective for feedback is to use directional microphones, but this is of limited use. As a last resort, vibration pickups attached to the instruments themselves have been used. These pickups sense either the vibration of the instrument at the spot where they are attached (contact pickup) or the vibration of a metallic string (magnetic induction pickup) of a stringed instrument. As these pickups do not respond to the sound in air produced by monitor speakers or other musical instruments, feedback and isolation problems are greatly reduced. Also, because they are attached to and move with the instrument, the problems of changing volume and tone quality caused by a performer's movement are eliminated.

The drawback to using contact or induction pickups, however, is that the result is extremely low fidelity. The vibrations of a string or sounding board of a violin, for example, are drastically different from the vibrations of the air around the instrument. But what is defined as the "acoustic sound" of the instrument is what the ear hears as the vibration produced in the air in response to the sum of vibrations of all the instrument's parts, as described above. Thus, these transducers have been very effective in developing new electric instruments with their own sound (especially electric guitar and electric bass). However, their abilities are limited for the high fidelity reproduction of sound from acoustic instruments.

For the above reasons, current practice for electronically transducing and filtering live music from acoustic instruments is to use a quality directional microphone or microphones set up near, and aimed at, a single instrument or group of instruments. These microphones send their signal via a special cable to a special pre-amplifier (which sometimes sends power to the mic). This then connects to general purpose equalizer and mixing circuits. For example, in a rock band a typical drum set (five drums, one hi-hat, and two cymbals) may have one directional microphone for each drum and the hi-hat, mounted on a stand very close to the drum, plus two "overhead" directional microphones for stereo effect and to pick up the cymbals. The two overhead microphones must be at least a foot or so from the cymbals to avoid picking up a loud metallic hum. A guitar may have one or two of these mics placed between one and three feet away.

As previously mentioned, it is also common to mount pickup devices directly on individual instruments, typically guitars, to produce a different type of sound from that produced by the conventional "acoustic" form of the same kind of instrument. These pickups sense the vibration of some part of the instrument, such as the front soundboard of a guitar. Examples of such pickups are described in U.S. Pat. No. 4,051,761 of Nylen, U.S. Pat. No. 4,143,575 of Oliver, U.S. Pat. No. 4,423,654 of Yamagami, U.S. Pat. No. 4,481, 854 of Dugas, U.S. Pat. No. 4,837,836 of Barcus, U.S. Pat. No. 5,136,918 of Riboloff, and U.S. Pat. No. 5,206,449 of McClish. The amplified sound from these vibration sensitive pickups mounted on either acoustic or so-called electric or electronic instruments differs intentionally from the sound produced by acoustic instruments and sensed by pressure type microphones mounted at a distance from the instrument; so these vibration pickups are not suitable for high fidelity electronic reproduction of the sound of an acoustic instrument.

It has been proposed to mount miniature pressure-sensitive microphones directly on musical instruments for specific purposes. For example, U.S. Pat. No. 4,837,836 issued to Barcus on Jun. 6, 1989 addresses the drawbacks of using stationary conventional microphones to pick up musical instruments in general, and also of holding a standard full size microphone close to, or attaching a miniature microphone directly to, an accordion or harmonica in particular. These drawbacks include feedback from nearby speakers and undesirable emphasis of the sounds coming from a localized portion of the elongated reed banks of accordions and harmonicas; that is, an increased volume of the notes whose reeds are near where the microphone is attached.

To overcome the drawbacks of the prior arrangements, Barcus provides a pickup module in which a miniature pressure-type microphone capsule is embedded. The module has an elongated narrow sound guide channel extending between oppositely facing open ends, and a sound sensitive surface area of the microphone communicates with the central region of the channel. The narrow sound channel creates a two-lobed directional sensitivity pattern for the microphone in an attempt to respond more equally to all notes when the module is centrally mounted on an elongated reed bank of a harmonica or accordion. Barcus also suggests that the module may be used with other musical instruments, and specifically that it can be attached to a drumhead near the edge of the drumhead to avoid feedback, pickup of an undesirable amount of room ambience, and lack of presence that occur with a conventional microphone stationed in front of the drum.

This lack of presence, a subjective term often used to describe a characteristic frequency band (which is different for each sound source), has not been noticed by the present inventor. However, in trials by the inventor using a variety of shapes, it has been noticed that strong, unnatural (and unpleasant) sounding frequency peaks are created by the shape of the cavity surrounding the microphone. These shaped microphone enclosures invariably add more problems than are solved in efforts to replicate the instrument's acoustic sound. The Barcus patent has a chart that looks like it may show improved frequency response, but it only shows improved evenness of volume from note to note. Test results of the inventor show each note would have a seriously degraded frequency response when compared to a high fidelity reference.

U.S. Pat. No. 5,262,586, issued to Oba et al. on Nov. 16, 1993, discloses a sound controller for an acoustic musical instrument to modify the sound produced by the instrument. In an example using a piano, the output of a detecting unit having 1) vibration sensors attached to the bridges and agraffes, 2) electromagnetic pickup units close to the strings, and 3) microphones attached to the sound board is delivered to a digital processing unit. Processors actuated by the various types of sensors for controlling loudness, delay, equalization, and phase difference deliver their output to vibration actuators mounted on the sound board and case boards of the piano. A parameter determining means adjusts the various processors so that the actuators create additional vibrations to produce acoustic sounds with modified qualities. Thus, Oba et al. use microphones as one of several types of pickups mounted inside a musical instrument to feed sounds and vibrations generated by playing the instrument to a vibration unit that alters the acoustic output of the instrument. Oba et al. do not use these microphones to produce an electronic signal in response to the acoustic output of the instrument for recording or amplifying the unmodified output. Consequently, none of the arrangements of the prior art provides a high fidelity solution to the problems of microphone isolation and placement encountered in electronic reproduction of sound from an acoustic musical instrument. Each case is currently successful only via careful tailoring by a sound engineer using sophisticated equipment.

SUMMARY OF THE INVENTION

The present invention provides a method for designing a system (microphones, attachment mechanisms, and associated preamplifiers, equalizers, and processors) to be used with solo or group musical instruments, and the system as designed by the method. A principal feature of the system is the use of one or more microphones placed proximately to, on or inside an instrument. For example, the microphone can be mounted permanently on or in the instrument, or it can be attached temporarily to the instrument with a clip designed for the specific instrument in question. It may also be held on a stand when feasible and preferable. While any microphone of suitable quality will do, a miniature microphone (and particularly when attached to the instrument) has two advantages. First, it is easier to accurately place, and will go in some places that a normal microphone will not fit. Second, it will move with a non-stationary (e.g., hand-held) instrument, and so avoid unwanted changes of sound quality that arise when an instrument moves relative to a microphone.

The system may include a suitably designed microphone preamp connected in tandem with and closely positioned (less than eight meters and preferably 3 to 6 meters) to at least one microphone. The microphone preamp delivers dc power to the microphone (if needed) as well as receiving, and initially amplifying, the audio signal from the microphone.

Another feature of the system is an equalizer unit that is "tailor-made" for each type of instrument and, more particularly, for a preselected optimum microphone location on each type of instrument. The equalizer may include conventional low pass, high pass, band pass, and/or notch filters, or other processors, as appropriate. Contrary to conventional general purpose equalizers having four or more adjustable filters, with up to three controls for each filter (a total of twelve or more knobs), these units may have only a minimum number and type of filters needed to compensate for the differences between the instrument's sound at a normal listening spot and the microphone attachment spot. Each filter control can be limited to the smallest useful range that allows enough flexibility for variations between individual instruments.

Each equalizer can be combined with a preamplifier in a small, lightweight package that can be mounted close to the performer. This allows the individual musicians to achieve their own preferred "sound" without needing a skilled audio technician to make complex multiple adjustments at a master equalizer console.

These features of the system sharply reduce the cost of the audio input equipment for a band or orchestra and dramatically shorten the time required to set up the equipment for a concert or recording session. They also enable a musician or other person to accomplish what is presently achievable only by a sound engineer.

As used herein, the term "reference sounds of the instrument" means sounds produced by the instrument that are desired to be duplicated in quality by the attached microphone and tailor-made equalizer. In its simplest form, it means the sound of an instrument being played and listened to in its normal environment (but generally exclusive of the room's influence on the sound). For example, if a guitar player plays a guitar in a pleasant and dry (non-reverberant) sounding room, the "reference sounds of the instrument" would be the acoustic signature of the sound at a good/normal listening position in that room. A second reference method is when a high quality reference microphone is used to capture this sound, and a third reference method is when the microphone signal is recorded on a hi quality storage device (such as a digital tape recorder).

When using a microphone reference, the listening site preferably is spaced from the instrument a sufficient distance to permit the reference microphone to pick up the optimum sound quality of the instrument (generally, a distance from the instrument equal to the width of instrument). This spot also should avoid the sound of the room. The room itself should be made to contribute minimally to the sound received at the microphone(s). A common terminology for this is to say the mic is placed in a mid-field position, and the room is dry or damped (literally="discouraged"). An anechoic chamber is an ideal room, as it would make certain aspects of the design process easier and perhaps more accurate. However, these rooms are rare and very expensive, and not necessary to the method.

Specifically, the present invention provides a method for designing a system for high fidelity reproduction of the sound of a selected type of acoustic musical instrument, and also for providing embodiments of the system, the method comprising:

(1) placing a first microphone proximately to the acoustic musical instrument;

(2) playing the musical instrument to produce sounds as picked up by the first microphone and playing reference sounds of the instrument;

(3) comparing the sounds of the musical instrument as picked up by the first microphone with the reference sounds of the instrument; and (4) designing a tailor-made equalizer to compensate for the differences between the sounds as picked up by the microphone and the reference sounds of the instrument.

The method of the present invention may additionally include:

selecting an attachment location in step 1 by locating the first microphone successively at a plurality of possible attachment locations that do not interfere with playing the instrument, playing the instrument to produce reference sounds of the instrument, comparing sounds as picked up by the first microphone at each attachment location with the reference sounds of the instrument, and selecting the attachment location at which the amplified microphone sound is closest to the reference sound of the instrument.

Although the step of comparing the sounds picked up by the first microphone with reference sounds of the instrument can be made by listening directly to the two sounds, a preferred embodiment of the method comprises:

(1) placing a first microphone proximately to the acoustic musical instrument;

(2) positioning a high quality reference second microphone at an appropriate listening site (normally mid-field, as discussed above) for the acoustic musical instrument;

(3) playing the musical instrument to produce reference sounds of the instrument as picked up by the reference second microphone;

(4) making simultaneous first and second audio recordings of the sounds of the musical instrument as picked up by the respective first and second microphones;

(5) comparing the first and second audio recordings to determine the audio differences between the recordings; and (6) designing a tailor-made equalizer for the first microphone to compensate for the differences of the first sound recording from the second sound recording.

The method of the invention may further include repeating the above steps (1) through (5) using different musical instruments of the same type to determine adjustment ranges for sections of the equalizer designed in step (6).

The fourth step of making simultaneous first and second audio recordings preferably can include making multi-track recordings on a digital or other high quality recording medium.

The fifth step of comparing the first and second audio recordings preferably includes displaying acoustic waveforms of the first and second recordings; equalizing one of the first and second waveforms to substantially conform to the other waveform; and using the equalization values to design the tailor-made equalizer for the first microphone in step (6).

The present invention also provides a system for high fidelity electronic reproduction of the sound of an acoustic musical instrument, the system comprising:

a microphone element or elements;

microphone attachment devices, where suitable or advantageous;

an equalizer having an input coupled to the microphone, the equalizer including a predetermined minimum number of electronic filter circuits, controls, and control ranges optimized to compensate for differences in the electronic reproduction by the microphone element, of sounds from the preselected type of acoustic musical instrument compared with corresponding reference sounds from the type of musical instrument.

The mounting device may also include a device for removably attaching the microphone to the instrument, the device being specifically designed for attachment at the preselected location on the particular instrument so as to avoid or minimize altering the sounds produced by the instrument and to enable a performer to play the instrument unencumbered.

The equalizer may comprise one or more electronic filter types, depending on the type of musical instrument. For example, a tailor-made equalizer for acoustic guitars has a high-pass filter and two notch (band-reject) filters. A tom-tom drum equalizer has one high-pass filter and one low-pass filter. A bass drum equalizer has three high-pass filters and one low-pass filter, with a total of five controls. Hi-hat and cymbal equalizers have only a high-pass filter in series with a single notch filter, but with three controls.

The above-described and other features and advantages of the invention are presented in the drawings in connection with the detailed description of the preferred embodiments.

DETAILED DESCRIPTION

According to the present invention, the microphone assembly includes a microphone such as an omnidirectional or unidirectional microphone element, such as a Model No. DPA 4060 microphone manufactured by Bruel and Kjaer. The microphone element can be attached to a clip or housing to permit for temporarily attaching the microphone assembly to a pre-selected spot on or in an acoustic musical instrument. Other temporary attachment arrangements may be provided when necessary. The clips or other attachment devices are selected to minimize mass loading of the instrument structure to which the microphone is attached. In some cases, permanent attachment of the microphone assembly to a specific musical instrument by suitable means may be acceptable. Alternatively, the microphone can be placed proximately to the musical instrument rather than being attached to the musical instrument.

Figure 1:
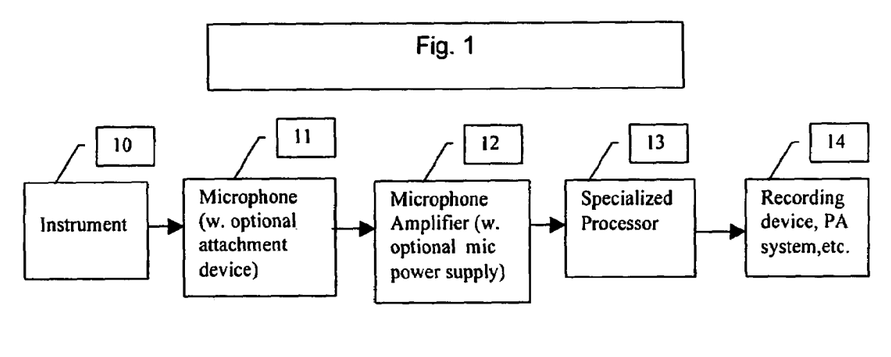
FIG. 1 is a general block diagram of an equalizer system designed according to an embodiment of the present invention.

Referring to FIG. 1, a general block diagram of an equalizer system is shown constructed according to an embodiment of the present invention. Block 10 represents an instrument such as the instruments described below. Sounds generated by instrument 10 are picked up by a microphone 11 (e.g., attached to the instrument). The sounds picked up by microphone 11 are provided to a microphone power supply (if needed) and amplifier 12 and a specialized processor 13 (e.g., a tailor-made equalizer as described below). The output of the specialized processor 13 is then provided to an appropriate output device 14 such as a recording device, a public address (PA) system, a speaker system, etc.

In practicing the method of the invention for designing a tailor-made microphone and equalizer system for a specific type of acoustic musical instrument, the first step is to place a microphone proximately to the instrument. Alternatively, the microphone can be attached to a location on or in an instrument of the selected type. The placement location is preselected with a view to sensing an airborne acoustic signature that is as little different as possible from the acoustic signature of the instrument when heard or sensed at a normal listening site spaced from the instrument. The term "listening site" refers either to a location for a human auditor or to a location for placement of a reference microphone to pick up sound for amplification.

What constitutes a normal listening site includes how much, if any, "room sound" (i.e. reverberation) is desired. The sound of an instrument differs in each room, and even varies significantly from place to place in a given room. Acoustic engineers designate a location where the sound of an instrument is augmented by room sound as the "far field" and a location where the sound of an instrument is substantially unaffected by room sound as the "mid field" or "near field."

In some recording or broadcast situations, with an instrument ensemble or orchestra in an exceptionally nice sounding environment such as Carnegie Hall, using microphones in the far field to involve the sound of the room can produce excellent results, so long as no sound reinforcement is required. Most often, however, room effect is undesirable, since a poorly selected listening site can produce results worse than having no room sound at all. In an anechoic chamber, or even a heavily draped and carpeted room, reverberation is essentially eliminated and there is no room sound, regardless of listening location. To eliminate the effect of room sound on the sound of an acoustic instrument without the expense of an anechoic chamber, it has become the norm in both the sound-reinforcement and recording and broadcast industries to use unidirectional microphones placed in what is called the mid field. The microphone is placed far enough away to get the natural sound of the entire instrument, but as close as possible to avoid the sound of the room. This distance is generally about the same as the average dimension of the instrument or a group of instruments.

Because unidirectional microphones reject only a portion of sound coming from unwanted directions, and because some unwanted sound comes from behind the instrument, a significant amount of room and other sound may be still picked up at a mid field listening position. To eliminate this, a microphone is placed in the near field, spaced about zero to twelve inches away from the instrument. This is known as "close micing." This strongly increases the ratio of instrument sound to room and other sound, because of the inverse square relation of distance from source to energy of sound. Close micing produces a less natural sound than listeners are used to, however; even the ears of the musician playing the instrument are further away than the close mic in most cases. Various processing equipment is usually needed to improve the nature of close-miced sound. The present invention improves and optimizes this, as shown below. It should be noted that for some instruments, however, particularly drumset components and certain vocal styles, a "close mic" sound has become the musical norm because the most common listening experience of these instruments has been a close-miced recording or performance. If close micing becomes more widely used, other instruments may have their 'sound' defined this way.

For most purposes, it is desirable to have a listening room comparable in equipment and sound characteristics to a professional recording studio. The following equipment list is given by way of example:

Unidirectional dynamic reference microphone (RefMic 1)—Sennheiser Model MD441 super-cardioid dynamic;

Unidirectional condenser reference microphone (RefMic 2)—Neumann K150 hyper-cardioid condenser;

Omnidirectional dynamic reference microphone (RefMic 3)—Sennheiser Model MD211 dynamic;

Microphone preamplifier (Mic Preamp 1)—John Hardy Model M1;

Microphone preamplifier (Mic Preamp 2)—Symetrix Model 201;

Parametric equalizer (EQ 1)—Orban Model 621B (four bands per channel);

Parametric equalizer (EQ 2)—Symetrix Model SX201 (three bands per channel);

Graphic equalizer (EQ 3)—DOD Model R-231 (one-third octave per band, 31 bands per channel);

Monitor amplifier (Amp)—Macintosh Model 6200;

Small near field monitor speaker (Spkr 1)—Rogers Model LS3/5A, BBC near field reference standard;

Large monitor speaker (Spkr 2)—Tannoy Dual-Concentric 12-inch, tuned to room with UREI Model 539 Room Equalizer;

Mixer (Mxr)—Hill Model B3 24×8×2 (uses 5532 operational amplifiers);

Multi-channel audio tape recorder—Alesis Digital Audio Tape (ADAT) multi-channel recorder, run at 48 kHz;

Real Time Analyzer (RTA)—Audio Control Model SA-3050A one-third octave with calibrated microphone (ANSI Class S1.11-1971)

The above list is not exhaustive, and the choice of manufacturer and model in each case is not intended to be exclusive. Other makes and models of comparable or better quality may be used.

The choice of a reference microphone depends on the choice of listening site. Repeated comparisons between a condenser microphone (RefMic 2) and several dynamic microphones (RefMic 1) rarely showed significant differences, however, and it is usually sufficient to use a RefMic 1.

As stated in the summary of the invention, the term, "reference sounds of the instrument," means sounds produced by the instrument that are desired to be duplicated in quality by the attached microphone and tailor-made equalizer. The quality or nature of sounds produced by the instrument will be different, however, for different rooms and for different placements of instrument and listener in a given room. Thus, the "reference" sounds used as a standard of comparison necessarily will involve subjective choice (this is true for all musical reproduction), but this subjectiveness is minimized by using a high quality (usually directional) microphone at a proper (usually mid-field) distance from the instrument in a room with minimal reverberation or other sound components. An anechoic chamber (rarely available) would be an ideal place for this purpose.

The step of playing the musical instrument to produce sounds as picked up by the first microphone and also reference sounds requires a skilled musician to play, with consistent volume and tone quality, a series of notes, chords, and musical phrases, as appropriate, to produce musical sounds representative of the full range of the instrument. As the musician plays, each note and chord is picked up by the first microphone, which may be coupled through a suitable preamplifier (e.g., Mic Preamp 1 or Mic Preamp 2), a conventional professional quality equalizer (e.g., EQ 1, EQ 2, or EQ 3), and an amplifier (Amp) to a monitor loudspeaker (e.g., Spkr 1 or Spkr 2) or to headphones, as desired. The musician produces the reference sounds either simultaneously or alternately with the corresponding sounds picked up by the first microphone, depending on which of several possible ways the comparing step is to be performed. As indicated above, the reference sound may be the acoustic sound of the instrument heard at the listening site or may be picked up by a reference microphone at the listening site that approximates an average "ideal" acoustic sound. (For comparison purposes, it may be processed through amplifying and equalizing equipment similar to that used with the first microphone.)

The step of comparing the sounds of the musical instrument as picked up by the first microphone with the reference sounds of the instrument may be performed in several ways. Each way preferably entails a skilled audio engineer, or equivalent in training, making the comparison between the two sounds and adjusting filters, equalizers, etc. to bring one sound into conformance with the other. It is well recognized in the audio engineering art that a skilled engineer or audio technician can discriminate between the acoustic signatures of similar sounds at least as well as any currently available audio test equipment. The following excerpts from articles in "Handbook for Sound Engineers—The New Audio Cyclopedia," 2nd edition, Glen Ballou, ed. (1991, H. W. Sams and Co., Div. Of Macmillan, Carmel Ind.) make this clear:

(Pg. 253) F. Miller: "The very best piece of test equipment you own is your set of ears and good judgement."

(Pg. 501) C. Hendrickson: "Some users or evaluators of sound equipment are actually capable of making judgements merely by listening to the sound quality of a loudspeaker with music or voice signals being the input. This is actually a learnable art and discipline."

(Pg. 1408) D. & C. Davis: "walking the audience areas while using the most sophisticated analyzer available, namely the trained ear-brain system, determine the best areas and the worst areas. Then measure with equipment in the best areas for reference use and the worst areas for correction purposes.

Watching an engineer place a measuring microphone relative to a given situation is more revealing than any resume of his experience."

In the simplest performance of the comparison step, the sound signal delivered by the first microphone to either a monitor loudspeaker or an earphone can be compared directly and simultaneously with the sound received acoustically by an audio engineer stationed at an equalizer located at the listening site. During repeated playings of a specific note or chord, the engineer adjusts the equalizer to bring the sound from the first microphone into coincidence with the reference sound heard directly.

An advantage of this way of comparing the sounds is that the reference sound is the true acoustic sound transmitted from the instrument to the listening site, unaffected by translation to and from electronic form. This way also presents several disadvantages, however. These include:

If two sounds are played together, they produce a single combined sound, and thus color each other, so it is nearly impossible to compare and equalize two simultaneous sounds. They must be listened to one at a time, which is somewhat less accurate than a direct comparison back-and-forth.

It may be desirable, for some applications, to provide a reference sound that differs from the pure acoustic signal delivered from the instrument to the listening site. The sound of a drumset and the sound of certain vocal styles are common examples where the placement of a microphone combined with the process of electronic modification has become the musically accepted standard of sound.

The preferred way of comparing the two sounds, therefore, is to simultaneously pick up and record the acoustic sound of the instrument with a second, reference microphone placed at the listening site. To obtain a complete record, the instrument should be played through a succession of notes and chords covering its full range, along with representative musical excerpts. This entire process is repeated with several instruments of the same type to be sure that differences in individual instruments are accounted for and will work within the final design parameters. The output of the reference microphone may be passed through a conventional studio-quality mixer or equalizer bank that is adjusted to create a compensated reference sound that, when fed to an amplifier and monitor speaker or headphones, produces an audio output that is identical, or as close as possible, to the direct unamplified sound of the musical instrument, or when different, is close to a reference sound desired in common practice. The equalizer for the first microphone may next be adjusted, through successive playings of the instrument, to bring the sound from the first microphone into conformance with the reference sound.

The settings of the equalizer for the first microphone then provide data for designing the tailor-made equalizer in the final step. Alternatively, after noting the initial settings of the equalizer for the second microphone, the technician may adjust that equalizer to bring the reference sound into conformance with the sound from the first microphone. The change in settings of the second equalizer then provides the data for designing the tailor-made equalizer of the invention. As further described below, this adjustment can also be done automatically.

The use of a second, reference microphone also permits a further improvement in the comparing step. Since both the sound from the first microphone and the reference sound have been converted to electronic form, they can be simultaneously recorded on separate tracks of a multi-channel tape recorder (e.g., ADAT). This has two advantages. First, the test data (notes, chord, and musical phrases) need be played only once, and then can be repeated identically again and again from the tape, as adjustments are made to the equalizer controls. This assures that the same sounds are being compared each time. Secondly, the sound from the first microphone and the reference sound can be separated and played back sequentially, which makes the task of comparing the sounds much easier. Depending whether the differences are relatively uniform through the high end or low end of the audio frequency spectrum or whether they are in one or more relatively narrow frequency ranges, appropriate high-pass, low-pass, band-pass, or notch filter circuits can be selected and combined and the component values determined by a competent technician to achieve the desired equalizer that is to be tailor-made for the selected type of instrument.

Figure 2A:
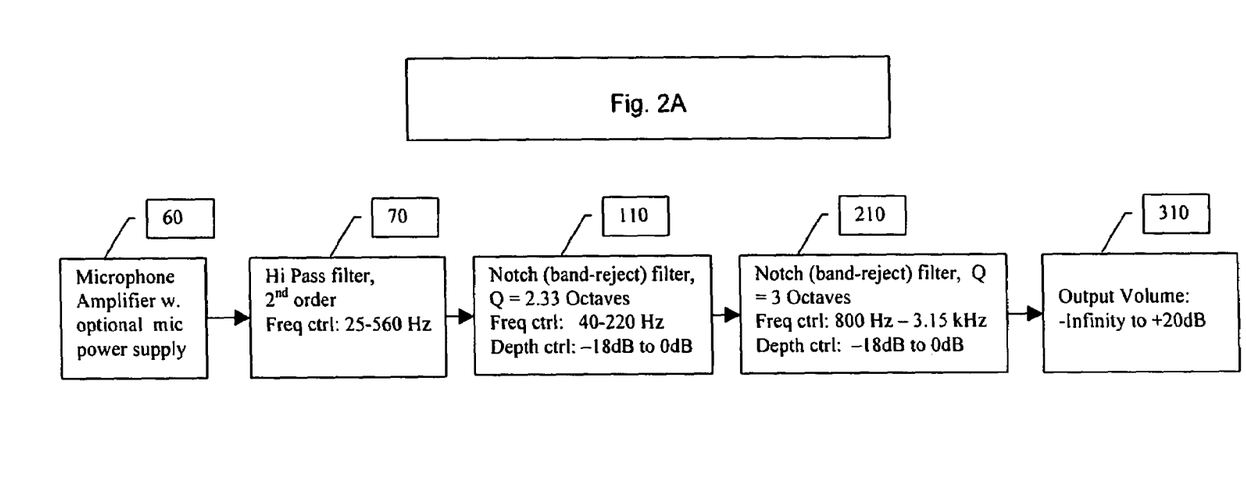
FIG. 2A is a general block diagram of an equalizer for a miniature microphone attached to an acoustic guitar.
Figure 2B:
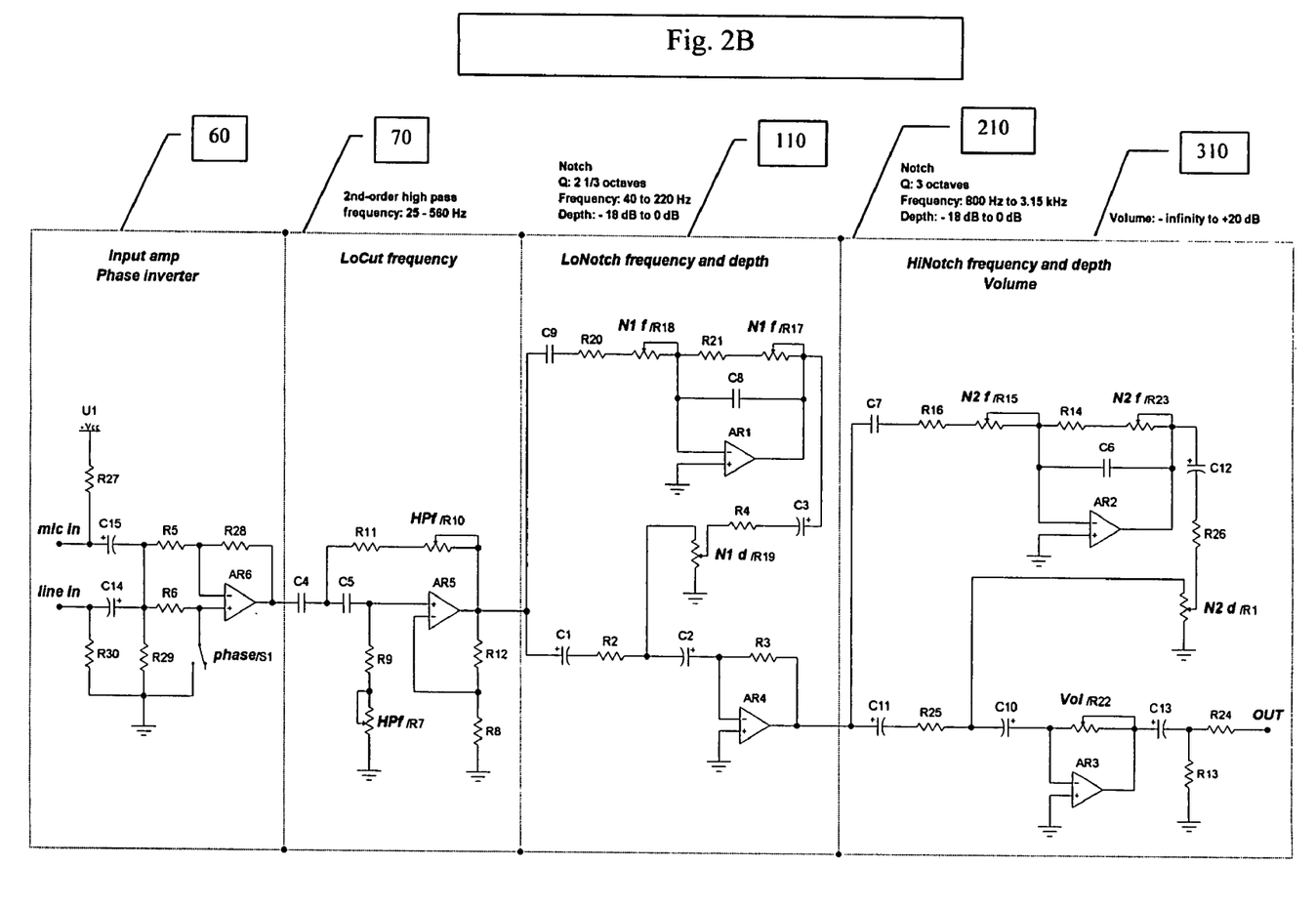
FIG. 2B is a schematic diagram of the circuit of FIG. 2A.

FIGS. 2A and 2B show the results of the above-described design process as applied to an acoustic guitar in which the miniature microphone assembly was attached by a special clip (not shown) to the sound-hole. In the equalizer of these figures, an input gain circuit 60 connects to a high-pass filter circuit 70 that, in turn feeds two band-reject filter circuits in series 110 and 210, which finally connect to an output amp circuit 310. Since the filters are typical of conventional textbook circuits, no further explanation of the their operation is needed.

Figure 3:
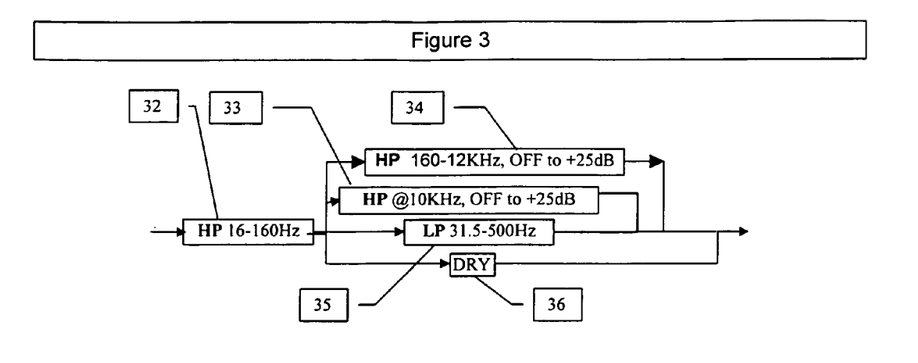
FIG. 3 is a block diagram of an equalizer circuit designed according to an embodiment of the invention for a bass drum.

FIG. 3 shows a block diagram of a tailor-made equalizer, designed by the method of the invention, for a bass drum. The output from a microphone (not shown) attached to a selected location on a bass drum would be fed through a preamplifier (not shown) to a high-pass filter 32 having an adjustable lower frequency roll-off of from 16 to 160 Hz. This circuit permits cutting off the strong low frequency component of the sound from a drum of this type, which could otherwise saturate the amplifier system. From high-pass filter 32, the signal passes through high-pass filter 33 (having a low-frequency roll-off at 10 kHz), through high-pass filter 34 (with an adjustable low frequency roll-off between 160 Hz and 12 kHz), and through low-pass filter 35 (having an adjustable high-frequency roll-off ranging from 31.5 to 500 Hz). Block 36, labeled "DRY" denotes a selectable bypass path around filters 33–35, to allow a comparison with the original sound.

Figure 4:
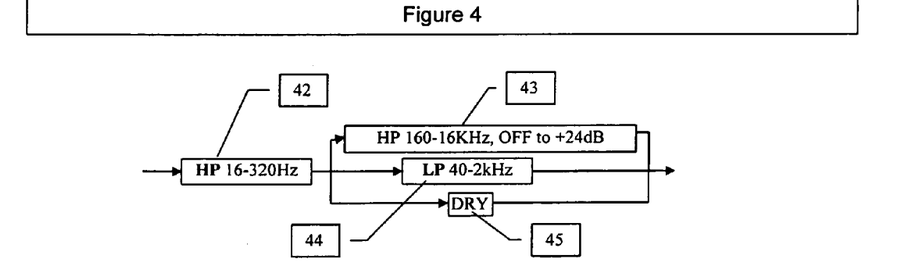
FIG. 4 is a block diagram of an equalizer circuit designed according to an embodiment of the invention for a snare drum.

FIG. 4 is a block diagram of an equalizer tailor-made for a snare drum. This equalizer also has a high-pass input filter 42 with an adjustable low frequency filter leading to high-pass filter 43 (with an adjustable low frequency roll-off between 160 Hz and 16 kHz), and a low-pass filter 44 (having an adjustable low frequency roll-off between 40 and 2 kHz). As in the bass drum equalizer of FIG. 3, there is a bypass "DRY" path 45.

Figure 5:
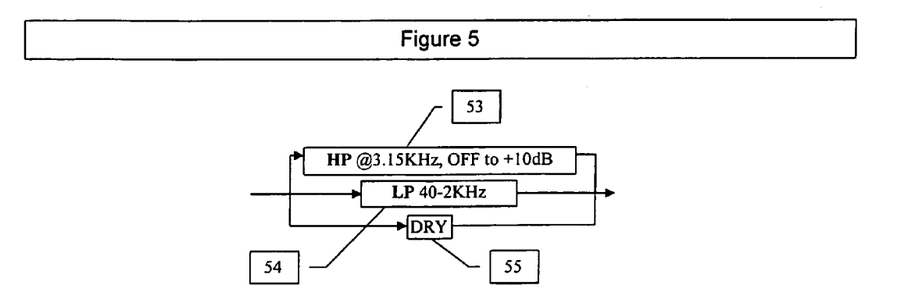
FIG. 5 is a block diagram of an equalizer circuit designed according to an embodiment of the invention for a tom-tom.

FIG. 5 illustrates a tailor-made equalizer for a tom-tom. This is a simple circuit having a high-pass filter 53 (with a fixed low frequency roll-off at 3.15 kHz) and a low-pass filter 54 (having an adjustable high frequency roll-off between 40 Hz and 2 kHz). As in the preceding drum equalizers, there is a bypass "DRY" path 55.

The foregoing examples of equalizers tailor-made for specific types of acoustic musical instruments demonstrate the simple, and therefore inexpensive, solution of the present invention for providing high fidelity audio reproduction of these instruments when combined with a microphone proximately placed or directly attached to the instrument.

A further advantage of the tailored equalizer system is a marked increase in the rejection of unwanted sounds, functionally equivalent to a sharp increase in the directional characteristics of the microphone. Also, this increase is accomplished without adding any added coloration (inaccuracies) to the sound. This coloration is very typical of directional microphones, especially as they become extremely directional, because they work by using phase cancellations, which are highly complex and unpredictable. "Off-axis" response (sound from the unwanted directions) is particularly problematic. The arrangement of tailored filter elements according to an embodiment of the present invention allows a natural sound to be produced from a spot much closer to the instrument than is usually possible. Because of this, the inverse-square relationship between distance and energy gives a marked increase in the ratio of wanted-to-unwanted sound, which is what a directional microphone attempts to do via phase cancellation. This increase happens without any additional phase cancellation, so the coloration of whatever microphone is used remains constant.

A further advantage of the method of the present invention is that it allows the use of omni-directional microphones in circumstances where previously not feasible. This is advantageous because an omni-directional microphone is inherently smaller, more accurate, and easier to make than a similar quality directional microphone. Even when using an omni-directional microphone, the amount of rejection provided by the method of the present invention equals or betters that provided by even highly directional microphones, in many circumstances. Since omni-directional microphones are inherently more natural sounding (no phase cancellations) and can be made significantly smaller (omni-directional microphones do not need the housing which directional microphones use to provide the desired cancellation), the system has the following advantageous effects with an omni-directional microphone:

1—The system allows closer placement of the microphone to the instrument.

2—The placement effects an increase in rejection.

3—The increase reduces or eliminates the need for a directional microphone, and thus allows the use of an omni-directional microphone.

4—The omni-directional microphone can be made smaller than a directional microphone allowing even closer placement to the instrument.

5—The new placement provides a further increase in rejection.

Also, at very close ranges, an omni-directional microphone is likely to pick up a more accurate acoustic signature than a uni-directional microphone (because it "sees" more of the instrument at a close distance). Because the microphone can be placed closer to the instrument, the signal-to-noise ratio of the omni-directional microphone with a tailored equalizing system of the present invention is higher than for a microphone placed further away from the instrument.

A system (especially a digital one) can be built that automatically accomplishes the method of the present invention. The hardware required is not specific to a particular instrument or even instrument type (except for the micro phone and attachment mechanism). An embodiment of this method includes the following steps:

1—Place 2 microphones (Mic 1=system microphone on or near instrument, Mic 2=reference microphone at a reference location as previously described).

2—Play reference sounds of the instrument.

3—Have a processor compare (e.g., via a fast fourier transform) signals from both microphones.

4—Have the processor create a digital filter algorithm (e.g., FIR) to match the Mic 1 signal to the Mic 2 signal and store the algorithm.

5—Repeat steps 2, 3, and 4 with different reference sounds (and store each algorithm).

6—Have the processor "average" the algorithms into a final algorithm (e.g. FIR).

7—Apply the final algorithm to a real time processor, such as a Digital Signal Processor (DSP).

The foregoing steps can be applied to a specific individual instrument. To eliminate the need for a user to do this, steps 1–7 may be repeated using several different instruments of the same type (e.g., several violins), and storing the results of the several averaged algorithms (in step 6). The results of the several algorithms can then be "averaged" into a composite final algorithm, which can be used "off the shelf" by a user not interested in the effort required to customize the system to a particular instrument. Since it is useful to provide the same number and range of controls as has been determined by the empirical version of the method, these controls would allow the user to tune either version to taste. The hardware required to run these algorithms is not specific to a particular instrument or even instrument type (except for the microphone and attachment mechanism). All that is required is that there be enough controls (e.g., knobs that are data wheels) for an instrument which may require the most manual tuning controls. Thus, various software (e.g., programs, data sets, etc.) for different instruments and instrument types, and even different reference sounds for instruments or instrument types, can be supplied on suitable media (ROM, diskette, etc.). The above described system of the present invention is a viable implementation of the method, regardless of whether the algorithms were derived as in the steps above, or whether an algorithm is created (separately) to imitate the filter elements derived using other methods, such as those described elsewhere herein.

It is advantageous, for both accuracy of result and ease of use, to be able to separately adjust the two sides of both a band-pass filter and a band-reject filter. This is because in many circumstances, the choices one makes about the placement of the two "sides" of a band-pass or band-reject filter are independent.

Figure 6:
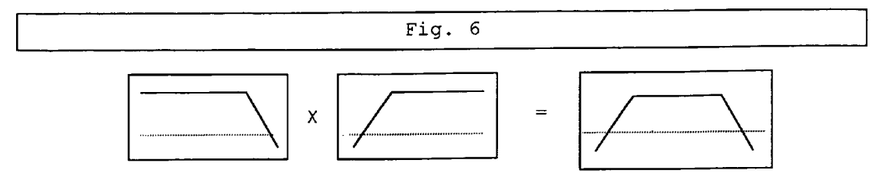
FIG. 6 is a graphic diagram showing how a low-pass and a high pass filter are combined in series as known in the art.

In the case of a band-pass filter in audio work, for example, where you choose to start rejecting low frequency sounds (like hum) has nothing to do with where you want to start rejecting high frequency sounds (like hiss). While a single parametric band-pass filter will create the shape needed, any single control will effect both sides; only by countering the change in one control with a simultaneous appropriate change in another will the one side that has been set remain steady, so the other side can be adjusted independently. In practice, this is impossible. Some available equalizers allow this by providing separate low pass and high pass filters in series. FIG. 6 shows how the typical combination of low pass and high pass in series yields a band pass transfer function.

Figure 7:
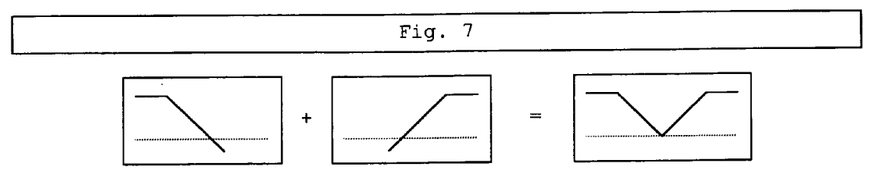
FIG. 7 is a graphic diagram showing how a low-pass and a high-pass filter are combined in parallel according to an embodiment of the present invention.

Typically a band-reject filter is used to eliminate a single frequency or a relatively narrow range, such as feedback ringing. It is also used to reduce a wide, shallow range. In most cases the rejection is placed around a center frequency conceptually. However, in instances where a large chunk of mid-range frequencies are rejected, it is sometimes more desirable to hear and think of two pass-band regions rather than one stop band. An example is a snare drum, which has a sound largely made of two portions. The first is a fairly low skin and shell resonance somewhere below 1 kHz (the sound of the drum with the snares "off"), and the second is the high end of the metal snares buzzing against the bottom skin, perhaps above 4 kHz. Trying to tune these 2 independent areas with a parametric band-reject filter poses the same problems of interdependence as in the case of the band-pass filter above. In this case separate high and low frequency controls are more useful in shaping a signal. FIG. 7 shows how a low pass and high pass may be used in parallel to create an easily controlled notch function.

Figure 8:
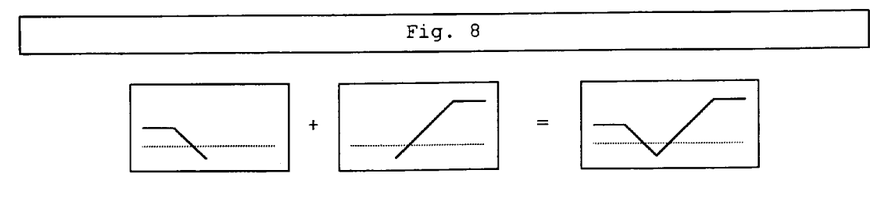
FIG. 8 is graphic diagram of a second embodiment of the present invention combining a low-pass filter and a high-pass filter in parallel.

An added advantage of this arrangement is that separate gain controls can be added to each of the filters, so that the balance of the high and low pass bands can be varied. FIG. 8 shows a circumstance where a snare drum has been tuned to emphasize more of the high end snare-buzz sound. This is extremely difficult or impossible with a parametric equalizer.

Referring back to FIG. 4, a block diagram is shown that includes an example of this arrangement in a filter designed for a snare drum. Element 43 is a tunable high-pass filter with a volume control. It is shown in series with a tunable low-pass filter 44 (a separate volume control is not shown). The schematic for this is a combination of straightforward textbook circuits, and is thus not shown in detail here. It could be imitated on some mixing consoles by sending the original signal to two separate channels, then using a tunable hi-pass filter on channel 1, a tunable low-pass filter on channel 2, and then mixing the results. This is a very cumbersome process, and the nature of the acoustical signals would have to be well understood to begin with for the user to attempt to try. According to an embodiment of the present invention, this circuit teaches the user to obtain these superior results without the need to understand any of these issues beforehand.

It is true that some digital equalizers (especially on sophisticated computer programs and synthesizer-workstations) allow the 'drawing' of virtually any shape of filter or filter combination. But these do not 'teach' the use of any proper combination and control of elements for any situation, and thus do not specifically imply what is accomplished here. In a digital implementation of the current invention, this special filter combination would be made available, with proper control parameters, as part of a 'preset' to the user for whatever circumstance was requested.

As stated above, a further advantage of the present invention is a large increase in signal-to-noise ratio obtained by the close micing made possible by the invention. The noise floor (inherent noise) of electrical equipment (microphones, amplifiers, equalizers, etc.) is constant. As the method allows the microphone to be placed closer to the sound source than other methods, the signal level becomes appreciably higher, whereas the noise of the components stays constant. This yields a significantly improved signal to noise ratio. In particular, it allows the use of a microphone and associated microphone pre-amp (and other associated electronics) that can have a much higher noise level than is usually tolerated using other methods. This allows the microphone itself to be made smaller and more cheaply (cheaper and perhaps fewer electronics need be included in the microphone capsule itself), and allows for less rigorous specifications for all the equipment described herein.

I claim:

1. A method for providing a system for high fidelity reproduction of the acoustic signal from a selected type of acoustical generator, the method comprising:
   (1) determining a selected location proximate to an acoustical generator;
   (2) placing a first microphone at said selected location;
   (3) separately generating sounds from the acoustical generator to produce sounds as picked up by the first microphone;
   (4) playing reference sounds of the acoustical generator;
   (5) comparing the sounds of the acoustical generator as picked up by the first microphone with the reference sounds as generated by the acoustical generator;
   (6) determining first and second differences in level over first and second respective discrete frequency ranges between the sounds of the acoustical generator as picked up by the first microphone at the selected location and the reference sounds as generated by the acoustical generator;
   (7) assembling a first filter element, said first filter element including components selected to compensate for said first difference in level over said first discrete frequency range;
   (8) assembling a second filter element, said second filter element including components selected to compensate for said second difference in level over said second discrete frequency range;
      wherein at least one of the first and second filter elements includes
         at least two adjustable parameters selected from the following: gain adjustment parameter, frequency adjustment parameter, bandwidth adjustment parameter, and filter shape adjustment parameter; and
         a single control to make concurrent, predetermined changes to said at least two adjustable parameters;
   (9) constructing an equalizer for the first microphone by arranging said first and second filter elements so as to compensate for the first and second differences between the sounds as picked up by the microphone at the selected location and the reference sounds as generated by the acoustical generator.

2. The method of claim 1 wherein in said placing step, said first microphone is attached to the acoustical generator.

3. The method of claim 2 wherein the step of comparing the sounds picked up by the first microphone with reference sounds of the acoustical generator is made by listening directly to the two sounds.

4. The method of claim 1 wherein the step of comparing the sounds picked up by the first microphone with reference sounds of the acoustical generator is made by listening directly to the two sounds.

5. The method of claim 1 wherein in said constructing step, the tailored filter elements include variable controls.

6. The method of claim 1 wherein at least one of frequency-bandwidth, gain, and Q parameters of at least one of said first and second filter elements has a limited variability range of operation based on the determining operation of step 6.

7. The method of claim 1 wherein a range of gain adjustment of the first filter element differs from a range of gain adjustment of the second filter element.

8. The method of claim 1 wherein at least one of frequency-bandwidth, filter order, and Q parameters differs between said first and second filter elements.

9. A method for providing a system for high fidelity reproduction of the acoustic signal from a selected type of acoustical generator, the method comprising:
   (1) determining a selected location proximate to a first embodiment of a selected type an acoustical generator;
   (2) placing a first microphone at said selected location;
   (3) separately generating sounds from the acoustical generator, to produce sounds as picked up by the first microphone;
   (4) playing reference sounds of the acoustical generator;
   (5) comparing the sounds of the acoustical generator as picked up by the first microphone with the reference sounds as generated by the acoustical generator;
   (6) replacing the first embodiment of the acoustical generator of step (1) with a next embodiment of the selected type of acoustical generator:
   (7) repeating steps (2) through (5) with the next embodiment of the selected type of acoustical generator;
   (8) constructing a tailor-made equalizer for the first microphone, said equalizer including an arrangement of tailored filter elements to compensate for differences between the sounds as picked up by the microphone at the selected location and the reference sounds as generated by the acoustical generator; wherein at least one of the filter elements includes
      at least two adjustable parameters selected from the following: gain adjustment parameter, frequency adjustment parameter, bandwidth adjustment parameter, and filter shape adjustment parameter; and
      a single control to make concurrent, predetermined changes to said at least two adjustable parameters.

10. The method of claim 9 wherein in said constructing step, the tailored filter elements include variable controls.

11. The method of claim 9 wherein a range of gain adjustment of the first filter element differs from a range of gain adjustment of the second filter element.

12. The method of claim 9 wherein at least one of frequency-bandwidth, filter order, and Q parameters differs between said first and second filter elements.

13. A system for high fidelity electronic reproduction of the acoustic signal from a selected type of acoustical generator, the system comprising:
   a microphone element adapted to be placed at a specified selected location proximate to the acoustical generator; and
   an equalizer that includes an arrangement of at least first and second filter elements to compensate for respective first and second differences in level between the sounds of the acoustical generator as picked up by the microphone at the selected location compared with corresponding reference sounds as generated by the acoustical generator over respective first and second discrete frequency ranges; wherein at least one of the first and second filter elements includes
      at least two adjustable parameters selected from the following: gain adjustment parameter, frequency adjustment parameter, bandwidth adjustment parameter, and filter shape adjustment parameter; and
      a single control to make concurrent, predetermined changes to said at least two adjustable parameters.

14. The system of claim 13 wherein the microphone element is further adapted to be attached to a preselected location on the acoustical generator.

15. The system of claim 13 wherein said equalizer includes at least one digital filter.

16. The system of claim 13 wherein in said equalizer, the tailored filter elements include variable controls.

17. The method of claim 13 wherein a range of gain adjustment of the first filter element differs from a range of gain adjustment of the second filter element.

18. The method of claim 13 wherein at least one of frequency-bandwidth, filter order, and Q parameters differs between said first and second filter elements.

* * * * *